United States Patent
Davis

(10) Patent No.: US 10,361,682 B2
(45) Date of Patent: Jul. 23, 2019

(54) FILTER FOR A BRUSHLESS DC MOTOR

(71) Applicant: Ultra Electronics Limited, Greenford, Middlesex (GB)

(72) Inventor: Andrew Ceri Davis, Cheltenham (GB)

(73) Assignee: Ultra Electronics Limited, Middlesex (GB)

( * ) Notice: Subject to any disclaimer, the term of this patent is extended or adjusted under 35 U.S.C. 154(b) by 0 days.

(21) Appl. No.: 15/600,005

(22) Filed: May 19, 2017

(65) Prior Publication Data
US 2017/0338803 A1 Nov. 23, 2017

(30) Foreign Application Priority Data
May 20, 2016 (GB) .................................. 1608888.2

(51) Int. Cl.
*H02P 6/18* (2016.01)
*H03H 17/02* (2006.01)
*H02P 6/15* (2016.01)
*H03H 17/00* (2006.01)
*H02P 7/03* (2016.01)

(52) U.S. Cl.
CPC ......... *H03H 17/0294* (2013.01); *H02P 6/153* (2016.02); *H02P 6/18* (2013.01); *H03H 17/0018* (2013.01); *H02P 7/05* (2016.02); *H03H 2017/0297* (2013.01)

(58) Field of Classification Search
CPC ...... G05B 19/404; G05B 19/19; G05B 19/33; G05B 5/01; G05D 3/1418
USPC .................................................. 318/632, 629
See application file for complete search history.

(56) References Cited

U.S. PATENT DOCUMENTS

| 5,767,643 A * | 6/1998 | Pham .................... H02P 6/15 318/400.06 |
| 7,528,566 B2 * | 5/2009 | Song ...................... H02P 23/07 318/139 |
| 2008/0252241 A1 | 10/2008 | Yu et al. |
| 2008/0252242 A1 | 10/2008 | Akama et al. |
| 2014/0145662 A1 * | 5/2014 | Lee ........................ H02P 6/182 318/400.35 |
| 2016/0197568 A1 | 7/2016 | Sung et al. |

FOREIGN PATENT DOCUMENTS

| EP | 3038248 A1 | 6/2016 |
| JP | 2005224048 | 8/2005 |
| WO | 2015012576 A1 | 1/2015 |

OTHER PUBLICATIONS

Intellectual Property Office of the UK; Search report for GB1608888.2; dated Nov. 9, 2016; 3 pages; South Wales, GB.

* cited by examiner

*Primary Examiner* — Rina I Duda
(74) *Attorney, Agent, or Firm* — Reed & Scardino LLP; Ross D. Snyder

(57) ABSTRACT

A filter for use with a brushless DC motor to filter a signal received from a floating terminal of the brushless DC motor, wherein the filter is configured such that a time delay introduced by the filter to the signal received from the floating terminal is equal to the time taken for a rotor of the motor to rotate through an angle equal to half of a commutation step of the motor.

16 Claims, 2 Drawing Sheets

FILTER FOR A BRUSHLESS DC MOTOR

TECHNICAL FIELD

The present application relates to a filter for a brushless DC motor.

BACKGROUND TO THE INVENTION

A three phase brushless DC (BLDC) motor is shown in FIG. 1. As can be seen, the motor (shown generally at 100) comprises a rotor 110 made up of one or more permanent magnets and a stator 120 which surrounds the rotor 110 and has first, second and third independently energisable electromagnets 130, 140, 150 equally angularly spaced around the periphery of the stator 120. Each of the electromagnets 130, 140, 150 has a terminal to which an electric current can be applied to energise the electromagnet.

The motor 100 is driven using a three phase electronic bridge. Current is applied to pairs of the electromagnets 130, 140, 150 via their respective terminals in a predetermined sequence, to generate a moving electromagnetic field within the motor which causes the rotor 110 to rotate.

A three phase BLDC motor has six rotational zones where current should be optimally applied to a pair of terminals. These are known as commutations, as the bridge 'commutes' the drive at each boundary. Each commutation step covers 60 degrees of rotation of the rotor.

In many sensorless BLDC motor implementations (i.e. implementations in which there are no sensors associated with the electromagnets for determining the position of the rotor), the terminal which is not being used to energise an electromagnet (known as the 'floating' terminal) can be used for determining the position of the motor, by measuring a back electromotive force (EMF) induced in the electromagnet due to the rotation of the rotor. It is well known that the voltage at the floating terminal is exactly equal to half of the voltage across the other two terminals at the mid-point between commutation boundaries (i.e. at 30 degrees for a three phase BLDC motor). This mid-point is known as the 'zero-crossing' point. A variety of time delay means are used to ensure that the commutation occurs 30 degrees after the zero-crossing point, to ensure efficient commutation.

In an electrically noisy environment it is necessary to filter the floating terminal voltage to eliminate environmental noise that may affect the zero-crossing detection. However, such filters delay the point in time at which the zero-crossing is observed. This delay is more significant at higher speeds and, unless compensated, results in reduced motor efficiency, as commutation occurs at sub-optimal times.

Accordingly, a need exists for a filter that reduces or eliminates high levels of environmental electrical noise in a brushless DC motor without unduly affecting zero-crossing detection and thus commutation accuracy.

SUMMARY OF INVENTION

According to a first aspect of the present invention there is provided a filter for use with a brushless DC motor to filter a signal received from a floating terminal of the brushless DC motor, wherein the filter is configured such that a time delay, introduced by the filter to the signal received from the floating terminal, is equal to the time taken for a rotor of the motor to rotate through an angle equal to half of a commutation step of the motor.

The filter of the present invention therefore facilitates effective suppression of environmental electrical noise whilst also permitting accurate zero-crossing detection and efficient commutation, without requiring additional components. Thus, the filter of the present invention enables brushless DC motors to be used efficiently in more electrically noisy environments than has hitherto been possible.

The filter may be a programmable digital filter.

For example, the filter may be a first order digital filter, with a difference equation of the form $$V_{f_n} \approx V_{f_{n-1}} + \frac{\delta t}{RC}[V_i - V_{f_{n-1}}]$$

where:
$V_i$ is a measured voltage at the floating terminal;
$V_f$ is the filtered voltage at the floating terminal;
$\delta t$ is the elapsed time between each sample of the measured voltage; and
RC is a filter time constant required to achieve the time delay equal to the time taken for the rotor to rotate through an angle equal to half of a commutation step.

The filter time constant RC may be calculated according to the equation $$RC = \frac{k}{MotorElectricalSpeed},$$

where k is a constant.

The value of the constant k may be 0.095.

The filter may be implemented in software.

The brushless DC motor may be a three phase brushless DC motor, for example.

The commutation step of the motor may be 60 degrees and the time delay introduced by the filter may be equal to the time taken by the rotor to rotate through an angle of 30 degrees.

BRIEF DESCRIPTION OF THE DRAWINGS

Embodiments of the invention will now be described, strictly by way of example only, with reference to the accompanying drawings, of which.

DESCRIPTION OF THE EMBODIMENTS

Figure 1:
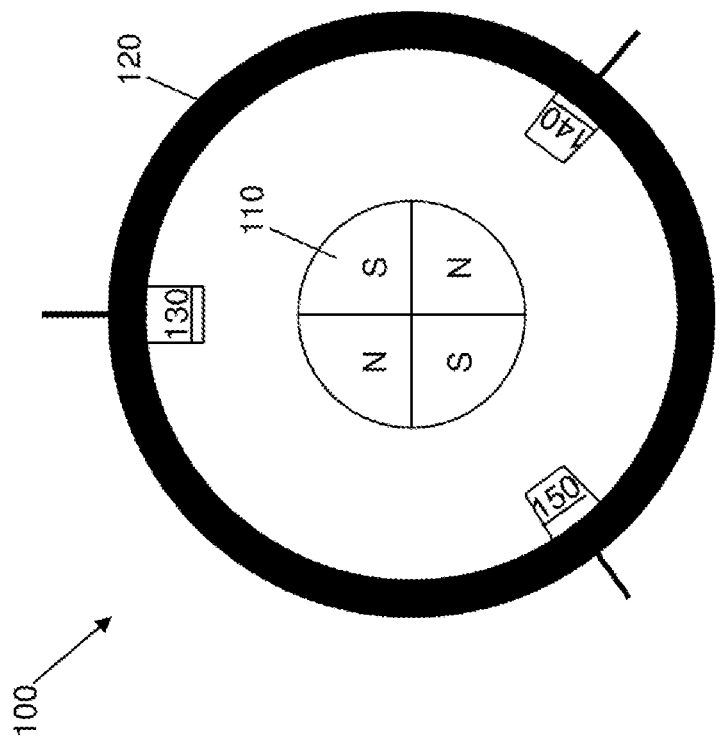
FIG. 1 is a schematic representation of a known three-phase brushless DC motor.
Figure 2:
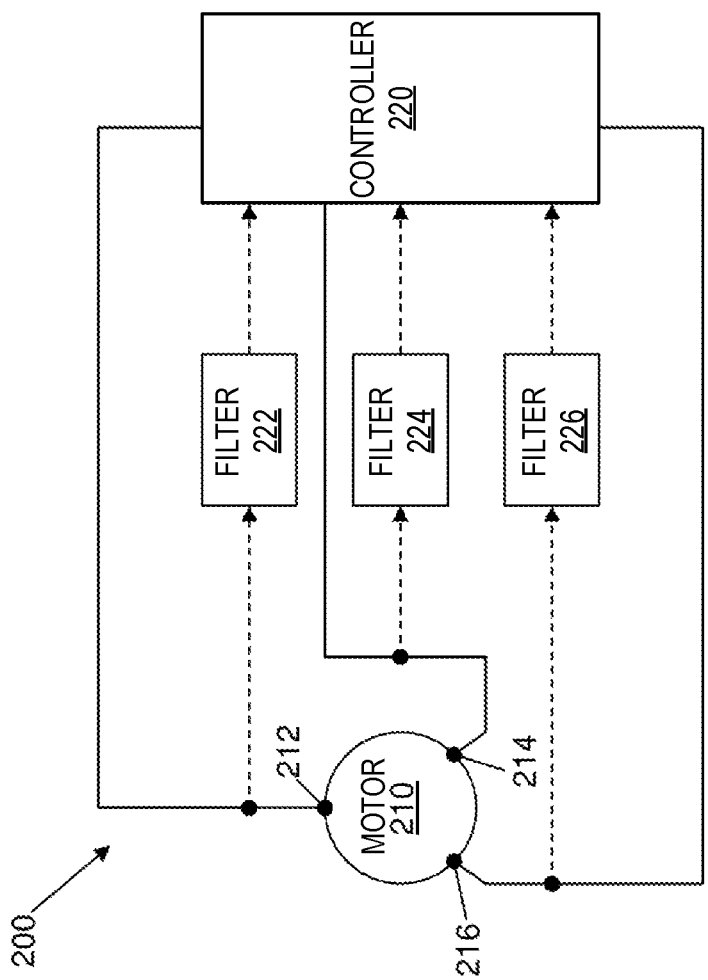
FIG. 2 is a schematic representation of a system for driving a brushless DC motor incorporating a filter according to the present invention.

Referring first to FIG. 2, a system for driving a brushless DC motor is shown generally at 200, and comprises a brushless DC motor 210 (which may be, for example, a brushless DC motor of the kind described above and illustrated in FIG. 1) and a controller 220, which is operative to control the operation of the motor 210 by energising pairs of electromagnets of a stator of the motor 210 in accordance with a predetermined sequence.

The motor 210 has a plurality (for example three) of terminals 212, 214, 216, each of which is connected to a respective electromagnet of the stator of the motor 210. Each terminal 212, 214, 216 is connected (directly or indirectly) to the controller 220 so as to receive signals issued by the controller 220 in order to energise the respective electromagnet at the appropriate time.

Each terminal 212, 214, 216 is also connected to an input of a respective filter 222, 224, 226, and each filter 222, 224, 226 has an output that is connected to the controller 220. Alternatively, only a single filter may be provided, with the terminals 212, 214, 216 being selectively connected to an input of the filter, e.g. by a multiplexer, when that terminal is not being used to energise a respective electromagnet of the stator.

The filter(s) 222, 224, 226 provide a connection between the motor 210 to the controller 220 that enables the controller 220 to detect the zero-crossing point in the voltage output by the floating terminal 212, 214, 216 (i.e. the terminal which is not currently being used to energise an electromagnet of the stator). In response to detection of the zero-crossing point the controller 220 generates appropriate signals to energise the next two pairs of electromagnets according to the predetermined sequence, to ensure continuous rotation of the rotor of the motor 210.

The purpose of the filter(s) 222, 224, 226 is to filter the voltage detected at the terminal 212, 214, 216 to which the filter 222, 224, 226 is connected, in order to provide to the controller 220 a signal from which environmental electrical noise has been eliminated or at least greatly attenuated, to facilitate detection of the zero-crossing points in the signal.

Additionally, the filters(s) 222, 224, 226 are configured with a much larger time delay than is used in prior art devices, in order to delay the signal from the terminal 212, 214, 216 by a time equal to the time taken by the rotor to rotate though half a commutation step. For example, in a three phase BLDC motor where the commutation step is 60 degrees, the time delay introduced by the filter(s) 222, 224, 226 is equal to the time taken for the rotor to rotate through 30 degrees. As soon as the zero-crossing point in the delayed signal is detected by the controller 220, it can issue a signal to cause the next pair of electromagnets to be energised according to the predetermined sequence. Thus, commutation can occur efficiently, without additional delay components being required.

In order for commutation to occur accurately over the entire speed range of the motor 210, the duration of the time delay introduced by the filters 222, 224, 226 must be reconfigurable. To this end, the filters 222, 224, 226 are implemented as programmable filters.

For example, the filters 222, 224, 226 may be implemented in software as first order digital filters, with a difference equation of the form $$V_{f_n} \approx V_{f_{n-1}} + \frac{\delta t}{RC}[V_i - V_{f_{n-1}}],$$

where:
$V_i$ is the measured voltage at the floating terminal;
$V_f$ is the filtered voltage at the floating terminal;
$\delta t$ is the elapsed time between each sample of the measured voltage; and
RC is the filter time constant required to achieve the time delay equal to the time taken for the rotor to rotate through half of a commutation step.

The optimal value for RC for any given speed can be found using the expression $$RC = \frac{k}{MotorElectricalSpeed},$$

where k is a constant that can be found empirically and is dependent upon the shape of the back EMF waveform for the particular motor. For example, a value of k=0.095 was found to be optimal for typical trapezoidal motor waveforms.

For a six commutation per electrical revolution BLDC motor, the filtered voltage can be estimated using the expression $$V_{f_n} \approx V_{f_{n-1}} + \frac{\delta t}{6kT_c}[V_i - V_{f_{n-1}}],$$

where $T_c$ is the motor commutation time.

The filters 222, 224, 226 facilitate effective suppression of environmental electrical noise, whilst also permitting accurate zero-crossing detection and efficient commutation, without requiring additional delay components. Thus, the filter of the present invention enables brushless DC motors to be used efficiently in more electrically noisy environments than has hitherto been possible.

Although the invention has been described in the context of a three phase brushless DC motor, it will be appreciated that the principles described herein are equally applicable to other brushless DC motor types. Additionally, a specific example of a first order programmable digital filter has been given, but it will be appreciated that any suitable filter configuration could equally be used to implement the filters 222, 224, 226.

The invention claimed is:

1. A control apparatus for controlling a brushless DC motor having a plurality of motor terminals, each of the plurality of motor terminals being connected to a respective electromagnet of the motor, the apparatus comprising:
   a controller arranged to be connected to the each of the plurality of terminals of the brushless DC motor; and
   a filter connected to the controller and arranged to receive a voltage signal from at least one of the plurality of motor terminals and to output a filtered voltage value to the controller, the filter having a filter time constant RC having a value such that the filtered voltage value output to the controller is delayed by a time taken for the brushless DC motor to rotate through half a commutation step such that commutation can be performed immediately upon zero-crossing point detection of the filtered voltage value.

2. The control apparatus according to claim 1 wherein the filter is a programmable digital filter.

3. The control apparatus according to claim 2 wherein the filter is a first order digital filter, wherein the filtered voltage value is estimated according to the following equation:

$$V_{f_n} \approx V_{f_{n-1}} + \frac{\delta t}{RC}[V_i - V_{f_{n-1}}],$$

where:
$V_i$ is a measured voltage at the at least one of the plurality of motor terminals;
$V_f$ is the filtered voltage at the at least one of the plurality of motor terminals; and
$\delta t$ is the elapsed time between each of a plurality of samples of the measured voltage.

4. The control apparatus according to claim 3 wherein the filter time constant RC is calculated according to an equation $$RC = \frac{k}{MotorElectricalSpeed},$$

where k is a constant.

5. The control apparatus according to claim 4 wherein the constant k is 0.095.

6. The control apparatus according to claim 1 wherein the filter is implemented in software.

7. The control apparatus according to claim 1 wherein the brushless DC motor is a three phase brushless DC motor.

8. The control apparatus according to claim 7 wherein the commutation step of the brushless DC motor is 60 degrees and the value of the filter time constant RC is such that the filtered voltage value output to the controller is delayed by a motor rotation angle of 30 degrees.

9. An apparatus for use with a brushless DC motor having a plurality of motor terminals, each of the plurality of motor terminals being connected to a respective electromagnet of the motor, the apparatus comprising:
  a filter having:
    a filter input node arranged to receive a voltage signal from at least one of the plurality of motor terminals; and
    a filter output node to output a filtered voltage value, the filter having a filter time constant RC having a value such that the filtered voltage value at the filter output node is delayed by a time taken for the brushless DC motor to rotate through half a commutation step such that commutation can be performed immediately upon zero-crossing point detection of the filtered voltage value.

10. The apparatus according to claim 9 wherein the filter is a programmable digital filter.

11. The apparatus according to claim 10 wherein the filter is a first order digital filter, wherein the filtered voltage value is estimated according to the following equation:

$$V_{f_n} \approx V_{f_{n-1}} + \frac{\delta t}{RC}[V_i - V_{f_{n-1}}],$$

where:
  $V_i$ is a measured voltage at the at least one of the plurality of motor terminals;
  $V_f$ is the filtered voltage at the at least one of the plurality of motor terminals; and
  $\delta t$ is the elapsed time between each of a plurality of samples of the measured voltage.

12. The apparatus according to claim 11 wherein the filter time constant RC is calculated according to an equation $$RC = \frac{k}{MotorElectricalSpeed},$$

where k is a constant.

13. The apparatus according to claim 12 wherein the constant k is 0.095.

14. The apparatus according to claim 9 wherein the filter is implemented in software.

15. The apparatus according to claim 9 wherein the brushless DC motor is a three phase brushless DC motor.

16. The apparatus according to claim 15 wherein the commutation step of the brushless DC motor is 60 degrees and the value of the filter time constant RC is such that the filtered voltage value output to the controller is delayed by a motor rotation angle of 30 degrees.

* * * * *